(12) United States Patent
Yu

(10) Patent No.: US 6,756,277 B1
(45) Date of Patent: Jun. 29, 2004

(54) REPLACEMENT GATE PROCESS FOR TRANSISTORS HAVING ELEVATED SOURCE AND DRAIN REGIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 108 days.

(21) Appl. No.: 09/779,985

(22) Filed: Feb. 9, 2001

(51) Int. Cl.$^7$ ............................................. H01L 21/336
(52) U.S. Cl. ........................ 438/300; 438/183; 438/303
(58) Field of Search ............................... 438/183, 222, 438/229, 197, 230, 299, 300, 301, 303, 306, 585, 591, 592, 595

(56) References Cited

U.S. PATENT DOCUMENTS

| | | | |
|---|---|---|---|
| 4,532,695 A | 8/1985 | Schuermeyer | |
| 4,683,645 A | 8/1987 | Naguib et al. | |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |
| JP | 5-206454 | 8/1993 |
| JP | 8-17845 | 1/1996 |
| JP | 11-102907 | 4/1999 |

OTHER PUBLICATIONS

"Sub 50–nm FinFET: PMOS" Huang, et al. Department of Electrical Engineering and Computer Sciences, University of California at Berkley, 1999, IEEE.

"Ultra–Thin–Body Silicon–On–Insulator MOSET's for Terabit–Scale Integration" Yu, et al., Department of Electrical Engineering & Computer Sciences.

"Sub–100nm Gate Length Metal Gate NMOS Transistors Fabricated by a Replacement Gate Process", Chatterjee, et al., International Electronic Devices Meeting, Dec. 7–10, 1997.

(List continued on next page.)

*Primary Examiner*—Jack Chen
(74) *Attorney, Agent, or Firm*—Foley & Lardner LLP

(57) ABSTRACT

A method of manufacturing an integrated circuit utilizes solid phase epitaxy to form an elevated source region and an elevated drain region. The method includes providing a mask structure including spacers, removing the mask structure, providing an amorphous semiconductor material and crystallizing the amorphous semiconductor material without damaging a high-k gate dielectric layer. The semiconductor material can be silicided. A shallow source/drain implant can also be provided.

20 Claims, 2 Drawing Sheets

U.S. PATENT DOCUMENTS

| | | |
|---|---|---|
| 4,745,082 A | 5/1988 | Kwok |
| 4,784,718 A | 11/1988 | Mitani et al. |
| 4,789,644 A | 12/1988 | Meda |
| 4,835,112 A | 5/1989 | Pfiester et al. |
| 4,954,867 A | 9/1990 | Hosaka |
| 4,998,150 A | 3/1991 | Rodder et al. ............. 357/23.1 |
| 5,102,816 A | 4/1992 | Manukonda et al. ......... 437/44 |
| 5,108,954 A | 4/1992 | Sandhu et al. |
| 5,168,072 A | 12/1992 | Moslehi |
| 5,200,352 A | 4/1993 | Pfiester |
| 5,258,637 A | 11/1993 | Sandhu et al. |
| 5,264,382 A | 11/1993 | Watanabe |
| 5,320,974 A | 6/1994 | Hori et al. |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,491,099 A | 2/1996 | Hsu |
| 5,516,707 A | 5/1996 | Loh et al. |
| 5,593,907 A | 1/1997 | Anjum et al. |
| 5,595,919 A | 1/1997 | Pan |
| 5,607,884 A | 3/1997 | Byun |
| 5,654,570 A | 8/1997 | Agnello |
| 5,675,159 A | 10/1997 | Oku et al. |
| 5,716,861 A | 2/1998 | Moslehi |
| 5,733,792 A | 3/1998 | Masuoka |
| 5,736,446 A | 4/1998 | Wu |
| 5,753,542 A | 5/1998 | Yamazaki et al. .......... 438/162 |
| 5,789,792 A | 8/1998 | Tsutsumi |
| 5,793,090 A | 8/1998 | Gardner et al. |
| 5,811,323 A | 9/1998 | Miyasaka et al. |
| 5,825,066 A | 10/1998 | Buynoski |
| 5,851,869 A | 12/1998 | Urayama |
| 5,856,225 A | 1/1999 | Lee et al. |
| 5,858,843 A | 1/1999 | Doyle et al. |
| 5,888,888 A | 3/1999 | Talwar et al. |
| 5,908,307 A | 6/1999 | Talwar et al. |
| 5,915,182 A | 6/1999 | Wu |
| 5,915,196 A | 6/1999 | Mineji |
| 5,949,105 A * | 9/1999 | Moslehi ...................... 257/336 |
| 5,953,616 A | 9/1999 | Ahn |
| 5,960,270 A | 9/1999 | Misra et al. |
| 5,985,726 A | 11/1999 | Yu et al. |
| 6,008,111 A | 12/1999 | Fushida et al. |
| 6,017,808 A | 1/2000 | Wang et al. |
| 6,025,254 A | 2/2000 | Doyle et al. |
| 6,030,863 A | 2/2000 | Chang et al. |
| 6,033,958 A | 3/2000 | Chou et al. |
| 6,037,204 A | 3/2000 | Chang et al. |
| 6,051,473 A | 4/2000 | Ishida et al. ............... 438/23.1 |
| 6,057,200 A | 5/2000 | Prall et al. |
| 6,072,222 A | 6/2000 | Nistler |
| 6,080,645 A | 6/2000 | Pan |
| 6,083,798 A | 7/2000 | Lin |
| 6,087,235 A | 7/2000 | Yu |
| 6,090,691 A | 7/2000 | Ang et al. |
| 6,096,614 A | 8/2000 | Wu |
| 6,103,609 A | 8/2000 | Lee et al. |
| 6,110,783 A | 8/2000 | Burr |
| 6,110,787 A | 8/2000 | Chan et al. |
| 6,124,176 A | 9/2000 | Togo |
| 6,137,149 A | 10/2000 | Kodama |
| 6,150,221 A | 11/2000 | Aoyama |
| 6,156,613 A | 12/2000 | Wu |
| 6,171,910 B1 | 1/2001 | Hobbs et al. |
| 6,184,097 B1 | 2/2001 | Yu |
| 6,187,642 B1 | 2/2001 | Yu et al. |
| 6,190,977 B1 | 2/2001 | Wu |
| 6,194,748 B1 | 2/2001 | Yu |
| 6,200,867 B1 | 3/2001 | Chen |
| 6,211,026 B1 | 4/2001 | Ahmad et al. |
| 6,216,357 B1 | 4/2001 | Victor et al. |
| 6,228,722 B1 | 5/2001 | Lu |
| 6,297,109 B1 * | 10/2001 | Chan et al. ................. 438/300 |
| 6,300,201 B1 | 10/2001 | Shao et al. |
| 6,300,203 B1 | 10/2001 | Buynoski et al. |
| 6,316,357 B1 | 11/2001 | Lin et al. |
| 6,365,474 B1 * | 4/2002 | Finder et al. ............... 438/305 |
| 6,380,043 B1 | 4/2002 | Yu |

OTHER PUBLICATIONS

"Silicon Processing for the VLSI Era, vol. 1: Process Technology", Wolf, et al., Lattice Press, pp 296–308.

"Silicon Processing for the VLSI Era, vol. 2: Process Integration" Wolf, et al., Lattice Press, pp 66, 67, 72, 73, 154, 155, 157, 158.

"Recrystallization of Implanted Amorphous Silicon Layers. I. Electrical Properties of Silicon Implanted with BF+2 or Si+ + B+a)" by Tsai, et al. Journal of Applied Physics, vol. 50, No. 1, Jan. 1979.

U.S. patent application Ser. No. 09/780,043 filed Feb. 9, 2001 "Fully Depleted SOI Transistor with Elevated Source and Drain" .

U.S. patent application Ser. No. 09/781,039 filed Feb. 9, 2001 "A Low Temperature Process to Locally Form High–K Gate Dielectrics".

U.S. patent application Ser. No. 09/779,987 filed Feb. 9, 2001 "A Process for Manufacturing MOS Transistors Having Elevated Source and Drain".

U.S. patent application Ser. No. 09/779,986 filed Feb. 9, 2001 "A Low Temperature Process for a Thin Film Transistor".

U.S. patent application Ser. No. 09/405,831 filed Sep. 24, 1999 "Process for Manufacturing MOS Transistors Having Elevated Source and Drain".

U.S. patent application Ser. No. 09/779,988 filed Feb. 9, 2001 "A Low–Temperature Process for a Thin Film Transistor".

U.S. patent application Ser. No. 09/609,613 filed Jul. 5, 2000 "Low Thermal Budget Process for Manufacturing MOS Transistors having Elevated Source and Drain Regions".

U.S. patent application Ser. No. 09/255,546 filed Feb. 22, 1999 "Locally Confined Deep Pocket Process for USLI MOSFETS".

U.S. patent application Ser. No. 09/397,217 filed Sep. 16, 1999 "Source/Drain Doping Technique for Ultra–Thin Body SOI MOS".

"CMOS Metal Replacement Gate Transistors Using Tantalum Pentoxide Gate Insulator", Chatterjee, et al. IEDM, 1998.

* cited by examiner

REPLACEMENT GATE PROCESS FOR TRANSISTORS HAVING ELEVATED SOURCE AND DRAIN REGIONS

CROSS REFERENCE TO RELATED APPLICATIONS

This patent application is related to U.S. application Ser. No. 09/405,831, filed on Sep. 24, 1999, now issued U.S. Pat. No. 6,248,637, by Yu, entitled "A Process for Manufacturing MOS Transistors Having Elevated Source and Drain Regions," U.S. application Ser. No. 09/255,546, filed on Feb. 22, 1999, now issued U.S. Pat. No. 6,271,095, by Yu entitled "Locally Confined Deep Pocket Process for ULSI MOSFETS," U.S. application Ser. No. 09/397,217 filed on Sep. 16, 1999, now issued U.S. Pat. No. 6,403,433 by Yu et al. entitled "Source/Drain Doping Technique for Ultra-Thin-Body SOI MOS Transistors," and U.S. application Ser. No. 09/384,121 filed on Aug. 27, 1999, now issued U.S. Pat. No. 6,265,293, by Yu entitled "CMOS Transistors Fabricated in Optimized RTA Scheme." This patent application is also related to U.S. Application Ser. No. 09/809,613 filed on Jul. 5, 2000, now issued U.S. Pat. No. 6,399,450 herewith by Yu entitled "A Process for Manufacturing MOS Transistors having Elevated Source and Drain Regions". This patent application is also related to U.S. patent application Ser. No. 09/781,039, now issued U.S. Pat. No. 6,495,437, filed on an even date herewith by Yu, entitled "Low Temperature Process to Locally High-K Gate Dielectric," U.S. patent application Ser. No. 09/779,987, now issued U.S. Pat. No. 6,403,434, filed on an even date herewith by Yu, entitled "A Process for Manufacturing MOS Transistors Having Elevated Source and Drain Regions and a High-k Gate Dielectric," U.S. patent application Ser. No. 09/780,043, filed on an even date herewith by Yu, entitled "Fully Depleted SOI Transistor with Elevated Source and Drain," U.S. patent application Ser. No. 09/779,988, filed on an even date herewith by Yu, entitled "Low Temperature Process for a Transistor with Elevated Source and Drain," and U.S. patent application Ser. No. 09/779,986, filed on an even date herewith by Yu, entitled "A Low Temperature Process For A Thin Film Transistor." All of the above patent applications are assigned to the assignee of the present application.

BACKGROUND OF THE INVENTION

The present application relates to integrated circuits (ICs) and methods of manufacturing integrated circuits. More particularly, the present application relates to a method of manufacturing integrated circuits having transistors with elevated source and drain regions and high-k gate dielectrics.

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The drain and source regions generally include a thin extension (shallow source and drain extension) that is disposed partially underneath the gate to enhance the transistor performance.

Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking capability of the silicon dioxide spacers.

As the size of transistors disposed on ICs decreases, transistors with shallow and ultra-shallow source/drain extensions become more difficult to manufacture. For example, a small transistor may require ultra-shallow source and drain extensions with a junction depth of less than 30 nanometer (nm). Forming source and drain extensions with junction depths of less than 30 nm is very difficult using conventional fabrication techniques. Conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically downward into the bulk semiconductor substrate. Also, conventional ion implantation and diffusion-doping techniques make transistors on the IC susceptible to short-channel effects, which result in a dopant profile tail distribution that extends deep into the substrate.

The source and drain regions can be raised by selective silicon (Si) epitaxy to make connections to source and drain contacts less difficult. The raised source and drain regions provide additional material for contact silicidation processes and reduce deep source/drain junction resistance and source/drain series resistance. However, the epitaxy process that forms the raised source and drain regions generally requires high temperatures exceeding 1000° C. (e.g., 1100–1200° C.). These high temperatures increase the thermal budget of the process and can adversely affect the formation of steep retrograde well regions and ultra shallow source/drain extensions.

The high temperatures, often referred to as a high thermal budget, can produce significant thermal diffusion which can cause shorts between the source and drain region (between the source/drain extensions). The potential for shorting between the source and drain region increases as gate lengths decrease.

In addition, high temperature processes over 750 to 800° C. can cause dielectric materials with a high dielectric constant (k) to react with the substrate (e.g., silicon). High-k (k>8) gate dielectrics are desirable as critical transistor dimensions continue to decrease. The reduction of critical dimensions requires that the thickness of the gate oxide also be reduced. A major drawback to the decreased gate oxide thickness (e.g., <30 Å) is that direct tunneling gate leakage current increases as gate oxide thickness decreases. To suppress gate leakage current, material with a high dielectric constant (k) can be used as a gate dielectric instead of the conventional gate oxides, such as thermally grown silicon dioxide.

High-k gate dielectric materials have advantages over conventional gate oxides. A high-k gate dielectric material with the same effective electrical thickness (same capacitive effect) as a thermal oxide is much thicker physically than the conventional oxide. Being thicker physically, the high-k dielectric gate insulator is less susceptible to direct tunnel leakage current. Tunnel leakage current is exponentially proportional to the gate dielectric thickness. Thus, using a high-k dielectric gate insulator significantly reduces the direct tunneling current flow through the gate insulator.

High-k materials include, for example, aluminum oxide ($Al_2O_3$), titanium dioxide ($TiO_2$), and tantalum pentaoxide ($TaO_5$). Aluminum oxide has a dielectric constant (k) equal to eight (8) and is relatively easy to make as a gate insulator for a very small transistor. Small transistors often have a physical gate length of less than 80 nm.

Thus, there is a need for an integrated circuit or electronic device that includes transistors having elevated source and drain regions and high-k dielectrics. Further still, there is a need for transistors with elevated source and drain regions manufactured in an optimized annealing process. Even further still, there is a need for elevated source and drain regions which are formed in a low thermal budget (low temperature) process. Yet further, there is a need for a transistor with elevated source and drain regions and a high-k gate dielectric. Yet even further, there is a need for a process of forming a transistor with elevated source and drain regions and a high-k gate dielectric in a post gate process that has a low thermal budget.

SUMMARY OF THE INVENTION

An exemplary embodiment relates to a method of manufacturing an integrated circuit. The integrated circuit includes a gate structure on a substrate. The substrate includes a shallow source extension and a shallow drain extension. The gate structure includes a gate conductor above a high-k gate dielectric. The method includes steps of providing a mask structure above the high-k gate dielectric layer on the substrate, etching the high-k gate dielectric layer in accordance with the mask structure, providing spacers on sidewalls of the mask structure, and removing the mask structure thereby leaving an aperture between the spacers. The method also includes providing an amorphous semiconductor layer above the substrate and over the gate structure and forming a single crystalline semiconductor material at an elevated source region and an elevated drain region from the amorphous semiconductor layer. The amorphous semiconductor layer fills the aperture between the spacers. The single crystalline semiconductor material is formed via a solid phase epitaxy process.

Another exemplary embodiment relates to a method of manufacturing an ultra-large scale integrated circuit including a transistor. The method includes providing a gate structure on a top surface of a substrate and providing a pair of spacers for the gate structure. The gate structure includes a sacrificial structure and a high-k gate dielectric. The method also includes removing the sacrificial structure, depositing an amorphous semiconductor material above the top surface of the substrate, and crystallizing the amorphous semiconductor material in an annealing process.

Yet another exemplary embodiment relates to a process of forming a transistor with elevated source and drain regions. The process includes providing a gate structure having a sacrificial structure and a high-k gate dielectric which is above a substrate, providing a spacer structure for the gate structure, removing the sacrificial structure, and depositing an amorphous semiconductor material above the substrate and the gate structure. The amorphous semiconductor material replaces the sacrificial structure. The process also includes crystallizing the amorphous semiconductor material to form single crystalline material.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
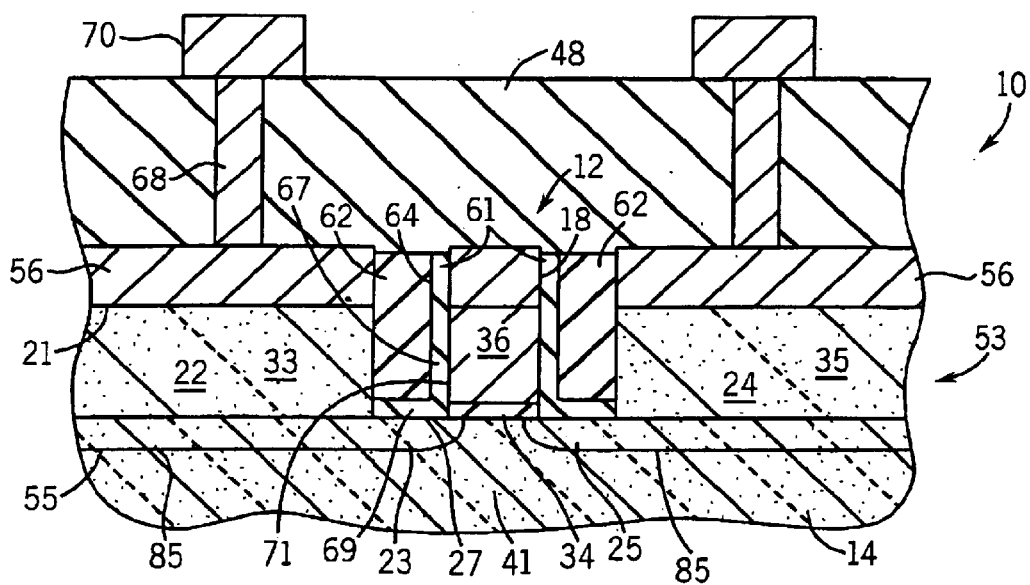
FIG. 1 is a schematic cross-sectional view of a portion of an integrated circuit in accordance with an exemplary embodiment of the present invention, the integrated circuit including a transistor with elevated source and drain regions and a high-k gate dielectric.

With reference to FIG. 1, a portion 10 of an integrated circuit (IC) includes a transistor 12 which is disposed on a semiconductor substrate 14, such as, a wafer. Semiconductor substrate 14 is preferably a bulk P-type silicon substrate. Alternatively, substrate 14 can be any type of IC substrate including gallium arsenide (GaAs), germanium, or a semiconductor-on-insulator (SOI) substrate (e.g., a silicon-on-glass substrate).

Transistor 12 can be a P-channel or N-channel metal oxide semiconductor field effect transistor (MOSFET) and is described below as an N-channel transistor. Transistor 12 includes a gate structure 18, an elevated source region 22, and an elevated drain region 24. Regions 22 and 24 extend from a top surface 21 (above a top surface 27 of substrate 14) to a bottom 55 in substrate 14. Regions 22 and 24 are 200–1000 Å deep (from surface 21 to bottom 55) and include a source extension 23, a drain extension 25, a deep source region 33, and a deep drain region 35. For an N-channel transistor, regions 22 and 24 are heavily doped with N-type dopants (e.g., $5\times10^{19}$–$1\times10^{20}$ dopants per cubic centimeter). For a P-channel transistor, regions 22 and 24 are heavily doped with P-type dopants ($5\times10^{19}$–$1\times10^{20}$ dopants per cubic centimeter).

Extensions 23 and 25 are preferably ultra-shallow extensions (e.g., junction depth is less than 20 nanometers (nm), 100–250 Å), which are thinner than regions 33 and 35. Extensions 23 and 25 are connected to regions 33 and 35, respectively, and are disposed partially underneath gate structure 18. Regions 33 and 35 are preferably more than 100 Å thick (e.g. 150 to 300 Å) from surface 21 to surface 27.

Channel region 41 can be doped in accordance with various device characteristics. A channel region 41 underneath gate structure 18 separates extensions 23 and 25. Region 41 can be doped in accordance with a steep retrograde well.

Ultra-shallow extensions 23 and 25 help transistor 12 achieve substantial immunity to short-channel effects. Short-channel effects can degrade the performance of transistor 12 as well as the manufacturability of the IC associated with transistor 12. Regions 22 and 24 and extensions 23 and 25 have a concentration of $10^{19}$ to $10^{20}$ dopants per cubic centimeter. Appropriate dopants for P-channel transistors include boron, boron diflouride, and iridium, and appropriate dopants for N-type transistors include arsenic, phosphorous, or antimony.

Gate stack or structure 18 includes a gate dielectric layer 34 and a gate conductor 36. Gate structure 18 has a height or thickness of 500–2000 Å and a width of 200–2000 Å. Dielectric layer 34 is preferably comprised of a high-k dielectric material. Layer 34 is, preferably a 2–10 nm thick conformal layer of tantalum pentaoxidep ($Ta_2O_5$), aluminum oxide ($Al_2O_3$), titanium dioxide ($TiO_2$) or other material having a dielectric constant (k) over 8. Dielectric layer 34 can be disposed directly over substrate 14. Layer 34 can be a 20–40 nm thick layer of amorphous $Ta_2O_5$ material.

A 30–40 nm thick layer of gate conductor 36 is disposed above dielectric layer 34. Gate conductor 36 is preferably a semiconductor, such as an amorphous silicon material. Alternatively, conductor 36 can be metal, polysilicon or polysilicon/germanium. Conductor 36 is doped with P-type or N-type dopants.

Gate structure 18 can also include liners 61 and spacers 62. Liners 61 and disposed between conductor 36 and spacers 62.

Liners 61 are preferably L-shaped and include a segment 67 and a segment 69. Segment 67 includes a sidewall 64. Segment 67 is disposed against sidewall 71 of gate conductor 36.

Segment 69 is preferably 300–800 Å wide (from left to right) and 50–200 Å thick (from top to bottom). Segment 67 is preferably 50–200 Å wide (from left to right) and 500–2000 Å thick (from top to bottom). Segments 67 and 69 preferably each have a relatively rectangular shape. Liner 61 can be comprised of an insulative material such as silicon dioxide, or other oxide material. Preferably, liners 61 are a different material than spacers 62. Liners 61 perform the function of being buffer layer between nitride spacer and silicon substrate (or polysilicon gate).

Spacers 62 abut sidewalls 64 of segments 67 of liners 61. Spacers 62 are preferably silicon nitride ($Si_3N_4$) having a width of 50–100 Å and a thickness (height) of 500–2000 Å. Spacers 62 provide an insulative buffer between conductor 36 and regions 22 and 24. Spacers 62 have a relatively rectangular shape.

A silicide layer 56 is disposed on top of source region 22 and drain region 24. Preferably, layer 56 is a nickel silicide ($WSi_x$). Alternatively, layer 56 can be any type of refractory metal and silicon combination, such as, cobalt silicide, tungsten silicide, or other silicide material. Preferably, layer 56 is 150–300 thick. Metal contacts 68 can be coupled to layer 56 through insulating layer 48 to connect regions 22 and 24 to conductive lines 70.

With reference to FIGS. 1-6, the fabrication of transistor 12, including high-k gate dielectric layer 34, elevated source region 22 and elevated drain region 24, is described as follows. The advantageous process allows deep source and drain regions 33 and 35 to be formed with appropriate dopant activation without adversely affecting layer 34. The process also reduces the lateral spread of dopants into channel 41 and thereby reduces susceptibility to short circuits between extensions 23 and 25 by maintaining temperatures below 600° C.

Figure 2:
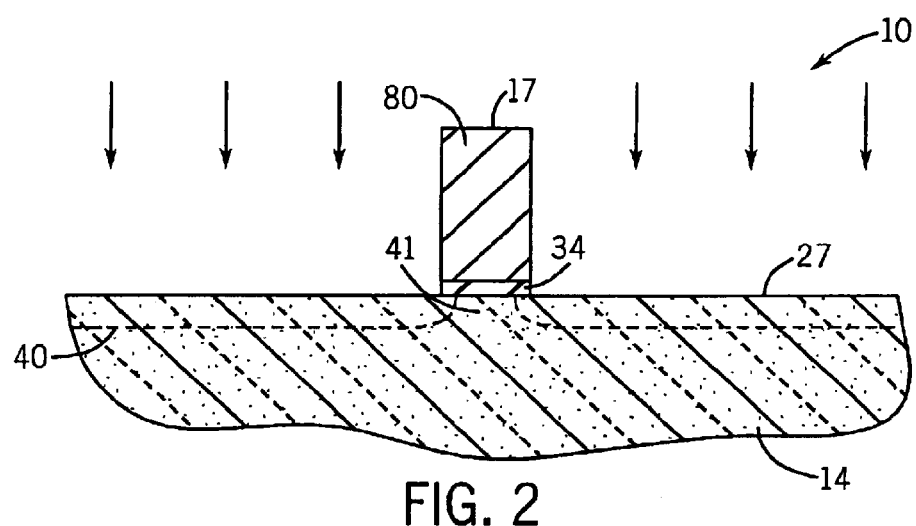
FIG. 2 is a schematic cross-sectional view of the portion of the integrated circuit illustrated in FIG. 1, showing a selective etching step, a shallow amorphization implant step, and a shallow source and drain extension dopant implant step.

With reference to FIG. 2, a sacrificial gate stack or mask structure 17 is provided including a photoresist feature 80. Mask structure 17 may further include a gate dielectric layer 34. Preferably, gate dielectric layer 34 is deposited or formed on top surface 27 of substrate 14. Layer 34 is preferably conformally deposited in a metal organic CVD process after any necessary high temperature annealing steps to prevent damage to the high-k material. Layer 34 can be deposited by sputtering or CVD. In another embodiment, layer 34 can be formed according to the process of U.S. Pat. No. 6,100,120. A layer of photoresist material or lithographic material is lithographically patterned to leave photoresist feature 80 above dielectric layer 34.

Feature 80 can be 20–200 nm wide. Feature 80 serves to protect channel region 41 and layer 34 during subsequent processing. For example, feature 80 can protect layer 34 during doping processes associated with the formation of transistor 12.

After feature 80 is formed, dielectric layer 34 is selectively etched to leave mask structure 17 on top surface 27 of substrate 14. Layer 34 is etched in accordance with feature 80. Layer 34 is etched by, for example, c!y etching to be 20–200 nm wide.

After mask structure 17 is formed, substrate 14 is subject to a shallow amorphization implant to form an amorphization or amorphous region 40. Amorphous region 40 can be created by subjecting substrate 14 to an ion implantation technique. Ion implantation can be performed by implantation devices manufactured by companies, such as, Verion Company of Palo Alto, Calif., Genius Company, and Applied Materials, Inc. Region 40 is preferably a shallow or thin amorphous region or layer,of substrate 14 (e.g., a depth between 100 and 600 Å) The implantation technique can charge semiconductor ions, preferably, electrically neutral species (such as, silicon;,germanium, or xenon ions) to approximately 10–100 kilo-electron volt (keVs) and implant them into; substrate 14. The silicon, germanium or xenon ions change the single, crystal silicon associated with substrate 14 into amorphous silicon at region 40. Region 40 corresponds to source and drain regions 22 and 24.

After region 40 is formed, substrate 14 is subjected to a follow-up dopant implant (a shallow source/drain extension dopant implant). Preferably, N-type or P-type dopants are provided by ion implantation to a depth of 100–250 Å below surface 27. The dopants can be implanted in a conventional ion implantation technique (e.g., as ions at 500–1000 keV at a dose of $2\times10^{14}$–$1\times10^{15}$ dopants per square centimeter). The source/drain extension dopant implant is for the formation of extensions 23 and 25 (FIG. 1) in substrate 14.

Figure 3:
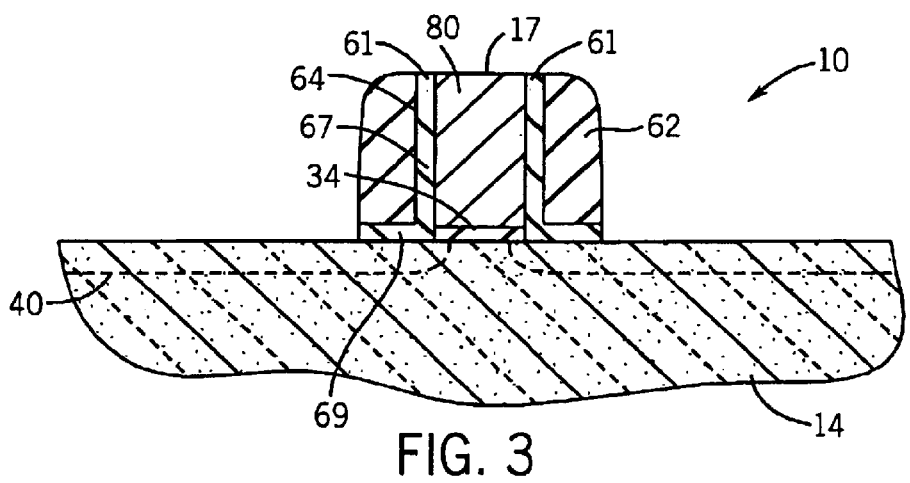
FIG. 3 is a schematic cross-sectional view of the portion of the integrated circuit illustrated in FIG. 1, showing a spacer structure formation step.

In FIG. 3, portion 10 is subject to a liner formation process. Preferably, a liner 61 is formed by conformally depositing a thin layer of insulative material. Preferably, the insulative material is an oxide, such as, a 50–200 Å thick silicon dioxide layer. The, conformal deposition is preferably performed at a low temperature (e.g., LTCVD at less than 400° C.). The low temperature process prevents recrystallization of amorphous region 40.

In FIG. 3, after the thin conformal layer for liners 61 is deposited, portion 10 is subjected to a spacer formation process which creates spacers 62 on sidewalls 64 of liners 61. Preferably, spacers 62 are narrow and are formed in a low temperature process (e.g., less than 400° C. to avoid recrystallization of region 40). Spacers 62 are preferably 50–200 Å wide (e.g., left to right) and 500–2000 Å thick (e.g., top (from a top surfaces of layer 80) to bottom (to top surfaces of segments 69)).

Spacers 62 can be formed in a conventional LTCVD and etch-back process. After the etch-back step, the conformal layer for liners 61 is etched using spacers 62 as a self-aligned mask. The conformal layer can be etched in a dry etching process selective to liners 61 with respect to spacers 62, thereby leaving segments 67 and 69 between spacers 62 and photoresist feature 80.

Figure 4:
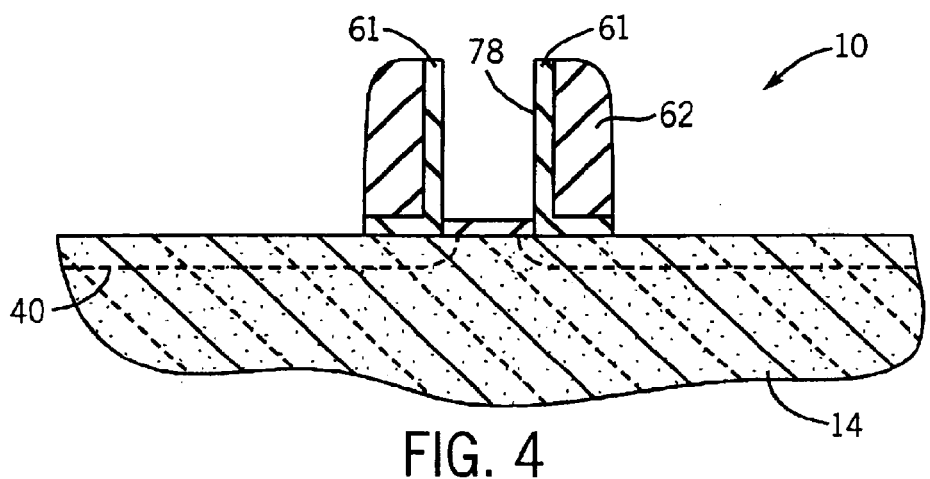
FIG. 4 is a schematic cross-sectional view of the portion of the integrated circuit illustrated in FIG. 1, showing a photoresist removal step.

In FIG. 4, after gate structure 18 is formed including liners 61 and spacers 62, portion 10 is subjected to a removal process to remove photoresist feature 80 (FIG. 3). The removal of feature 80 creates an aperture 78 between liners 61. Aperture 78 can be 20–200 nm wide, the same width as feature 80. Feature 80 can be stripped according to a conventional wet etching technique.

Figure 5:
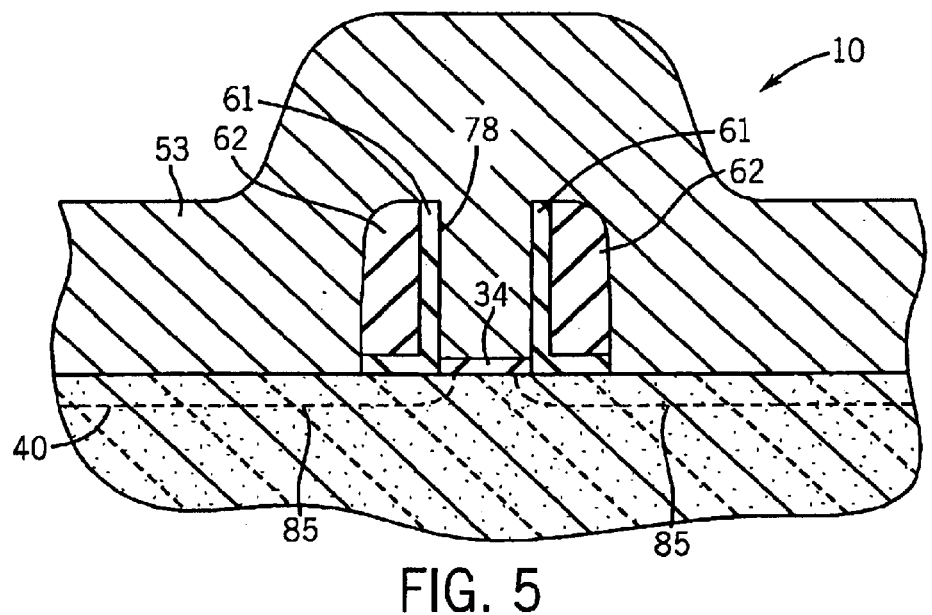
FIG. 5 is a schematic cross-sectional view of the portion of the integrated circuit illustrated in FIG. 1, showing an amorphous semiconductor deposition step.

In FIG. 5, after aperture 78 is formed, portion 10 is subjected to a deposition process which provides an amorphous semiconductor layer 53 above substrate 14. Layer 53 is preferably a 2000–5000 Å thick film of the same material as substrate 14 (e.g., silicon). Alternatively, layer 53 can be or include other semiconductor materials such as germanium.

Layer 53 is preferably conformally deposited to fill aperture 78. Layer 53 can be deposited by low pressure, chemical vapor deposition (LPCVD) at temperatures of less than 450° C. (400–450° C.). Layer 53 corresponds to portions of regions 33 and 35 above top surface 27 of substrate 14 and to gate conductor 36 (See FIG. 1).

Layer 53 is preferably an in-situ doped silicon material. Layer 53 is in-situ doped utilizing non-neutral dopants, such as, phosphorous (P), boron (B), arsenic (As), antimony (Sb), indium (In), and gallium (Ga). The dopants correspond to source region 22 and drain region 24 (FIG. 1). Alternatively, layer 53 can be deposited as an undoped material and implanted with non-neutral dopants.

After layer 53 is deposited, an amorphous material border 85 is located between layer 538 and substrate 14. Border 85 includes region 40. Region 40 underneath spacers 62 and liners 61 corresponds to shallow source d drain extensions 23 and 25 discussed with reference to FIG. 1.

Figure 6:
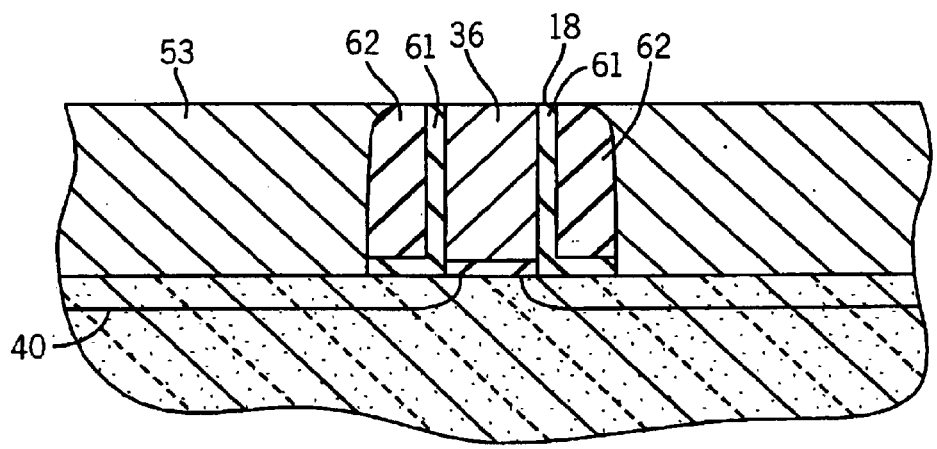
FIG. 6 is a schematic cross-sectional view of the portion of the integrated circuit illustrated in FIG. 1, showing a chemical mechanical polish (CMP) step and an annealing step.

In FIG. 6, after layer 53 is provided over substrate 14, layer 53 is subject to a planarization process, such as, a chemical mechanical polish (CMP). The CMP step removes layer 53 to expose spacers 62 in structure 18.

After the CMP step to expose spacers 62, an overetch technique can further lower layer 53, spacers 62, liners 61 and conductor 36. Preferably, the overetch forms rectangular-shaped spacers 62 (FIG. 1). The overetch process used to expose spacers 62 can be a dry or wet etch process. The overetch step prevents bridging during subsequent silicidation steps described below with reference to FIG. 1. Alternatively, the overetch process can be a continuation of the CMP step used to expose spacers 62.

In FIG. 1, after overetching, layer 53 is subjected to an annealing process. The annealing process changes the structure of layer 53 from an amorphous state to a single crystalline state (e.g., melts layer 53 which subsequently recrystallizes). Substrate 14 below border 85 acts as a seed layer for layer 53.

In one embodiment, the annealing process is a low temperature furnace annealing at less than 600° C. (550–600° C.). The annealing technique utilizes principles of solid phase epitaxy to crystallize layer 53 and shallow amorphous region 40. The annealing process activates dopants in layer 53 and region 40.

Solid phase epitaxy refers the crystallization process by which an amorphous semiconductor film (silicon, silicon/germanium, or germanium) is converted into crystalline semiconductor (silicon, silicon/germanium, or germanium) of a single orientation matching the orientation of existing crystalline semiconductor (silicon, silicon/germanium, or germanium) start layer (e.g., substrate 14). Solid phase epitaxy is usually achieved by heating the amorphous material.

The solid phase epitaxy is performed at a low temperature so that the thermal budget in the process is not adversely affected. In this way, dielectric layer 34 is not affected by the transformation of the layer 53 from an amorphous state to a single crystalline state.

In one alternative embodiment, the annealing process can be an excimer laser annealing process (e.g., 308 nanometer wavelength for a pulse duration of several nanoseconds). The annealing technique using the excimer laser can raise layer 53 to the melting temperature of layer 53 (1100° C.). The melting temperature of layer 53 in the amorphous state is significantly lower than that of substrate 14 in the single crystalline state. The melting temperature of amorphous silicon is 1100° C. and the melting temperature of single crystalline silicon is 1400° C. Preferably, the annealing process is controlled so that layer 74 is fully melted and layer 64 is not melted. After the energy associated with the annealing process is removed, layer 74 is recrystallized as single crystalline material.

Liners 61 and spacers 62 as well as conductor 36 advantageously protect layer 34 during the annealing process. Conductor 36 preferably remains in an amorphous state during annealing.

In FIG. 1, layer 56 is formed above regions 22 and 24 and conductor 36. Layer 56 is preferably formed in a self-aligned silicidation process. The silicidation process is preferably a low temperature 400–500° C. nickel silicide process. Layer 56 can be CoSi$_2$, TiSi, NISi$_2$, etc. Elevated source and drain regions, regions 22 and 24, allow space for layer 56 to form, thereby decreasing source/drain contact resistance. Layer 56 is preferably 150–300 Å thick and approximately 30–50 percent of its thickness consumes layer 53.

With reference to FIG. 1, after layer 56 is formed, layer 48 is deposited in accordance with a tetraethylorthosilicate (TEOS) process. Preferably, layer 48 is 5000–15000 Å thick. After layer 48 deposited, conventional MOSFET fabrication processes can be utilized to form contacts 68, lines 70, vias, interconnects, and other devices necessary for portion 10 of the integrated circuit.

According to one embodiment, after deposition of layer 48, layer 48 is planarized and etched to form vias for contacts 68. Contacts 68 can be provided to connect layers 56 to conductive lines 70. Conductive lines 70 can be formed above layer 48 by conventional interconnect layer fabrication processes.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of structures are shown, other structures can be utilized. Various changes may be made to the details disclosed without departing from the scope of the invention which is defined by the following claims.

What is claimed is:

1. A method of manufacturing an integrated circuit, the integrated circuit including a gate structure on a substrate, the substrate including a shallow source extension and a shallow drain extension, the gate structure including a gate conductor above a high-k gate dielectric layer, the method comprising steps of:

providing a mask structure above the high-k gate dielectric layer on the substrate;

etching the high-k gate dielectric layer in accordance with the mask structure;

providing spacers on sidewalls of the mask structure;

removing the mask structure thereby leaving an aperture between the spacers;

providing an amorphous semiconductor layer above the substrate, the amorphous semiconductor layer filling the aperture and having a top surface higher than a top of the spacers;

removing the amorphous semiconductor layer to expose the top of the spacers; and forming a single crystalline semiconductor material at an elevated source and an elevated drain location from the amorphous semiconductor layer via a solid phase epitaxy process.

2. The method of claim 1, further comprising:

before the providing spacers step, forming a shallow amorphous region in the substrate and doping the shallow amorphous region.

3. The method of claim 1, further comprising:

after the forming step, siliciding the single crystalline material at the elevated source location and at the elevated drain location.

4. The method of claim 3, wherein the siliciding step is a nickel silicide process performed at a temperature of less than 500° C.

5. The method of claim 1, wherein the spacers include an L-shaped liner.

6. The method of claim 1, wherein the forming step includes a furnace annealing step.

7. The method of claim 1, wherein the amorphous semiconductor layer includes silicon.

8. The method of claim 1, wherein the substrate includes single crystalline silicon.

9. The method of claim 1, wherein the amorphous semiconductor layer includes silicon germanium.

10. A method of manufacturing an ultra-large scale integrated circuit including a transistor, the method comprising:

providing a gate structure on a top surface of a substrate, the gate structure including a sacrificial structure and a high-k gate dielectric:

providing a pair of spacers for the gate structure;

removing the sacrificial structure to form an aperture between the spacers;

depositing an amorphous semiconductor material above the top surface of the substrate, the amorphous semiconductor material filling the aperture and covering the spacers;

removing a portion of the amorphous semiconductor material so that the amorphous semiconductor material in the aperture is separated from the amorphous material above the top surface of the substrate by the spacers; and crystallizing the amorphous semiconductor material in an annealing process.

11. The method of claim 10, further comprising:

providing a source and drain extension amorphization implant before the spacers are provided.

12. The method of claim 11, further comprising:

polishing the amorphous semiconductor material before the a crystallizing step.

13. The method of claim 12, further comprising:

providing a silicide layer above the substrate.

14. The method of claim 13, wherein the step of providing a silicide layer is performed at a temperature of less than 500° C.

15. The method of claim 10, wherein a final gate conductor includes amorphous silicon.

16. The method of claim 15, wherein the sacrificial structure is a photoresist feature.

17. A process of forming a transistor with elevated source and drain regions, the process comprising:

providing a gate structure having a sacrificial structure and a high-k gate dielectric, the high-k gate dielectric being disposed above a substrate;

providing a spacer structure for the gate structure;

removing the sacrificial structure;

depositing an amorphous semiconductor material above the substrate and the spacer structure, the amorphous semiconductor material covering the spacer structure, the amorphous semiconductor material replacing the sacrificial structure;

removing the amorphous semiconductor material to expose the spacer structure; and crystallizing the amorphous semiconductor material to form single crystalline material.

18. The process of claim 17, further comprising:

doping the substrate for shallow source and drain extensions before the spacer structure is provided.

19. The process of claim 17, wherein the spacer structure includes rectangular spacers.

20. The process of claim 19, wherein the spacer structure includes L-shaped liners.

* * * * *

UNITED STATES PATENT AND TRADEMARK OFFICE
CERTIFICATE OF CORRECTION

PATENT NO. : 6,756,277 B1
DATED : June 29, 2004
INVENTOR(S) : Bin Yu

It is certified that error appears in the above-identified patent and that said Letters Patent is hereby corrected as shown below:

Column 10,
Line 25, delete "a" before "crystallizing".

Signed and Sealed this

Twenty-first Day of September, 2004

JON W. DUDAS
*Director of the United States Patent and Trademark Office*